(12) United States Patent
Ha et al.

(10) Patent No.: US 7,894,264 B2
(45) Date of Patent: Feb. 22, 2011

(54) CONTROLLING A MEMORY DEVICE RESPONSIVE TO DEGRADATION

(75) Inventors: Chang Wan Ha, San Ramon, CA (US); Ramin Ghodsi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 531 days.

(21) Appl. No.: 11/983,241

(22) Filed: Nov. 7, 2007

(65) Prior Publication Data

US 2009/0116283 A1   May 7, 2009

(51) Int. Cl.
    *G11C 11/34* (2006.01)
(52) U.S. Cl. .............................. 365/185.17; 365/185.22; 365/185.29
(58) Field of Classification Search ............ 365/185.17, 365/185.22, 185.29, 185.03, 185.3, 189.07, 365/191
    See application file for complete search history.

(56) References Cited

U.S. PATENT DOCUMENTS

| 6,775,187 | B1 | 8/2004 | Hamilton et al. | ........ 365/185.28 |
| 7,315,482 | B2 * | 1/2008 | Lin et al. | ................. 365/210.1 |
| 7,542,350 | B2 * | 6/2009 | Park et al. | .............. 365/185.24 |
| 7,577,036 | B2 * | 8/2009 | Sarin et al. | ................ 365/185.2 |
| 2006/0126391 | A1 | 6/2006 | Kim et al. | .............. 365/185.22 |
| 2006/0291289 | A1 | 12/2006 | Lee | ....................... 365/185.22 |
| 2007/0242521 | A1 * | 10/2007 | Taito et al. | ............ 365/185.23 |
| 2008/0151619 | A1 * | 6/2008 | Melik-Martirosian | .... 365/185.3 |

\* cited by examiner

*Primary Examiner*—Dang T Nguyen
(74) *Attorney, Agent, or Firm*—Dorsey & Whitney LLP

(57) ABSTRACT

Embodiments of the present invention disclosed herein include devices, systems and methods, such as those directed to non-volatile memory devices and systems capable of determining a degradation parameter associated with one or more memory cells. Disclosed devices and systems according to embodiments of the present invention include those that utilize the degradation parameter to adjust control signals coupled to the memory cells.

39 Claims, 6 Drawing Sheets

CONTROLLING A MEMORY DEVICE RESPONSIVE TO DEGRADATION

TECHNICAL FIELD

This invention relates to memory devices, and, more particularly, in one embodiment to a system and method for controlling non-volatile memory devices.

BACKGROUND OF THE INVENTION

With increasing popularity of electronic devices, such as laptop computers, portable digital assistants, digital cameras, mobile phones, digital audio players, video game consoles and the like, demand for non-volatile memories are on the rise. Non-volatile memories come in various types, including flash memories. Flash memories are widely used for rapid information storage and retrieval in electronic devices such as those mentioned above.

A typical flash memory device includes a memory array containing a large number of flash memory cells arranged in rows and columns. Two common types of flash memory array architectures are the "NAND" and "NOR" architectures, so called for the logical form in which the basic flash memory cell configuration or each is arranged. FIG. 1 illustrates a typical NAND flash memory array 10 of conventional design. The array 10 is comprised of a large number of flash memory cells, collectively indicated by reference numeral 14. The array of flash memory cells 14 is typically divided into a number of blocks, one of which is shown in FIG. 1. Each block includes a number of rows, which, in the example shown in FIG. 1, includes 32 rows. The cells 14 in the same row have their control gates coupled to a common word line 30, each of which receives a respective word line signal WL0-WL31.

As also shown in FIG. 1, the cells 14 in the same column have their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a select gate SG(D) signal. Each of the bit lines 20 output a respective bit line signal BL1-BLN indicative of the data bit programmed in the respective column of the array 10. The bit lines 20 extend through multiple blocks to respective sense amplifiers (not shown). The source of the lower flash memory cell 14 in the block is coupled to a source line 26 through a second select gate transistor 28. The conductive state of the transistors 28 in each block are controlled by a select gate SG(S) signal.

The storage capacity of a flash memory array can be increased by storing multiple bits of data in each flash memory cell 14. This can be accomplished by storing multiple levels of charge on the floating gate of each cell 14. These memory devices are commonly referred to as multi-bit or multi-level flash memory cells, known as "MLC memory cells." In MLC cells, multiple bits of binary data corresponding to distinct threshold voltage levels defined over respective voltage ranges are programmed into a single cell. Each distinct threshold voltage level corresponds to a respective combination of data bits. Specifically, the number N of bits requires $2^N$ distinct threshold voltage levels. For example, for a flash memory cell to be programmed with 2 bits of data, 4 distinct threshold voltage levels corresponding to bit states 00, 01, 10, and 11 are needed. When reading the state of the memory cell, the threshold voltage level for which the memory cell 14 conducts current corresponds to a combination of bits representing data programmed into the cell.

During the life of a non-volatile memory cell, the cell will typically be cycled through many program and erase operations as different data is programmed in, erased from, and read from the cell. Repeated use of the memory cell over time, including hundreds or thousands of such cycles, causes its operation to drift and its response to voltage applied to place the cell in a given threshold voltage state to change the threshold voltage necessary to erase or program the cell changes. FIG. 2A generally depicts the threshold voltage necessary for programming and erasing a cell drifting over many cycles for a given program pulse with a constant magnitude and time. Therefore to maintain the required erase and program threshold voltage level a change in voltage and/or duration is needed. FIG. 2A shows the case where the cell becomes harder to erase but easier to program. In FIG. 2A, the voltage necessary to perform these operations drifts in the same direction. For example, if the threshold voltage necessary to erase or program the cell moves up, the cell becomes harder to erase in that a larger voltage will be necessary to erase the cell, while the cell is easier to program in that a smaller voltage will be sufficient to program the cell. The threshold voltages can also drift in the opposite directions such that the cell becomes harder to program and easier to erase. Further, the threshold voltages necessary to program and erase themselves may, under some conditions drift in opposite directions, as shown in FIG. 2B, such that the difference between the voltage necessary to erase and the voltage necessary to program (the "window") becomes smaller.

Accordingly, there is a need for, among other things, a system including a non-volatile memory array that accommodates drifting threshold voltages of cells in the array.

DETAILED DESCRIPTION

During the life of a non-volatile memory cell, parameters of the cell may change over time as the cell endures many cycles of programming and erasing. In particular, the threshold voltage necessary to read, program, or erase the cell may change over time.

One way to address the changing behavior of a cell is to simply count the number of cycles a memory cell has endured, and adjust the control voltages supplied to the cell based on projected or modeled knowledge of how the cell will change over time. This approach, however, requires that the memory device be programmed with the number of cycles that each cell has endured. This approach also requires a model of how the cell will degrade over a particular number of cycles.

Embodiments of the present invention discussed herein are directed to non-volatile memory devices and systems where actual and/or representative degradation of a memory cell is measured directly (hereinafter such measured degradation being referred to as a "degradation parameter"), and knowledge about the degradation (captured by the degradation parameter) is used to adjust the control signals provided to the cell. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 1:
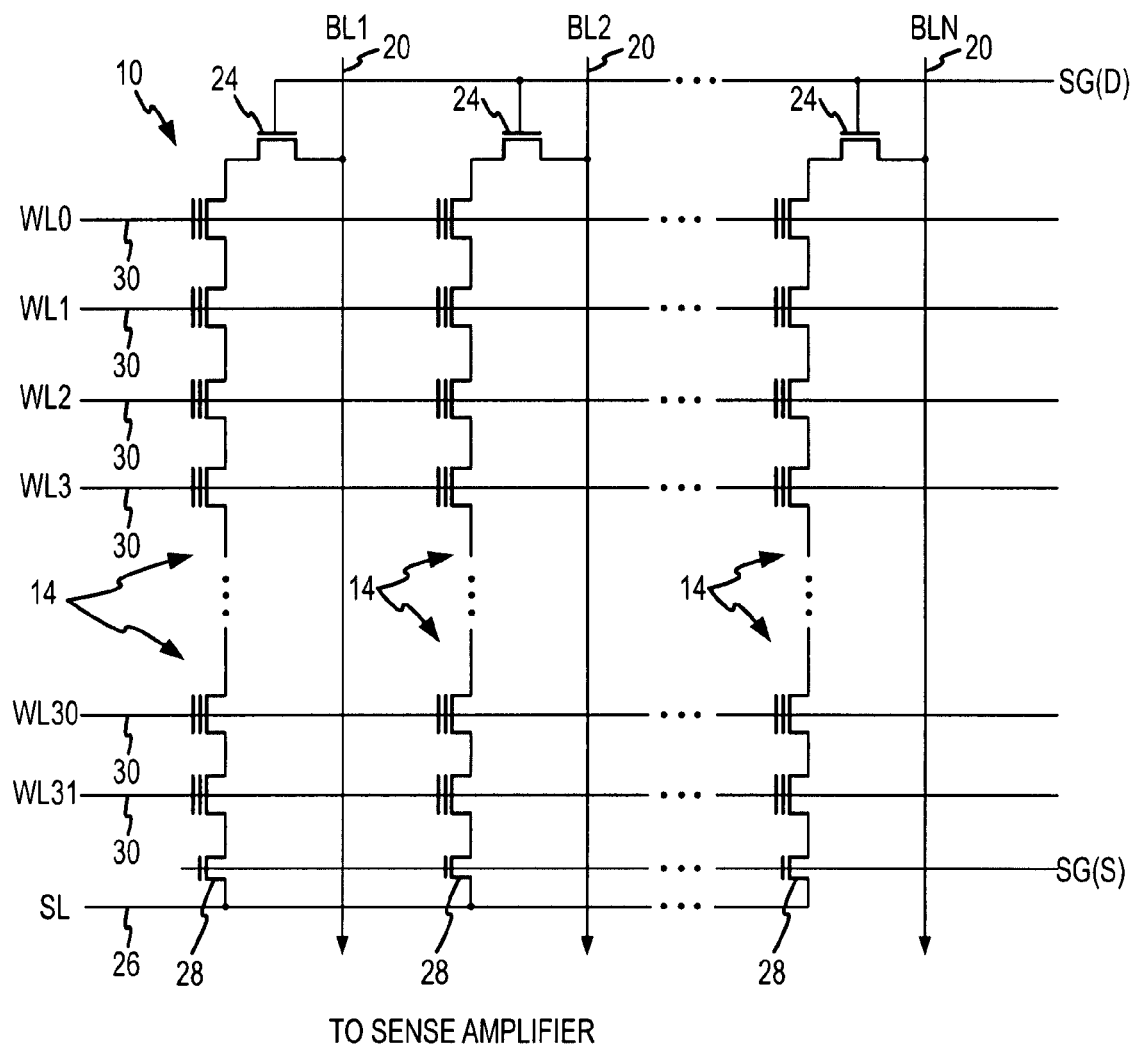
FIG. 1 is a schematic diagram showing a conventional NAND array of flash memory cells.
Figure 2A:
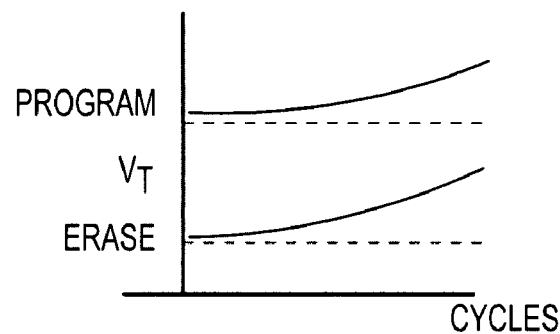
FIGS. 2A and 2B are graphs generally depicting examples of varying threshold voltages as a memory cell is cycled over time.
Figure 2B:
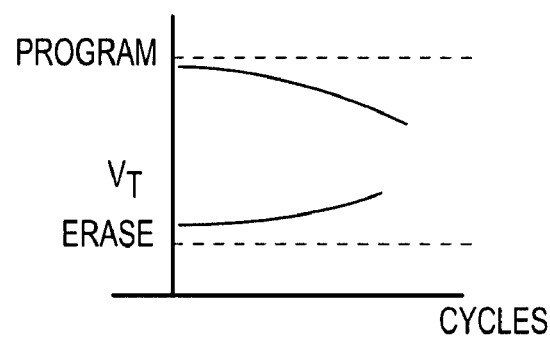
Figure 3:
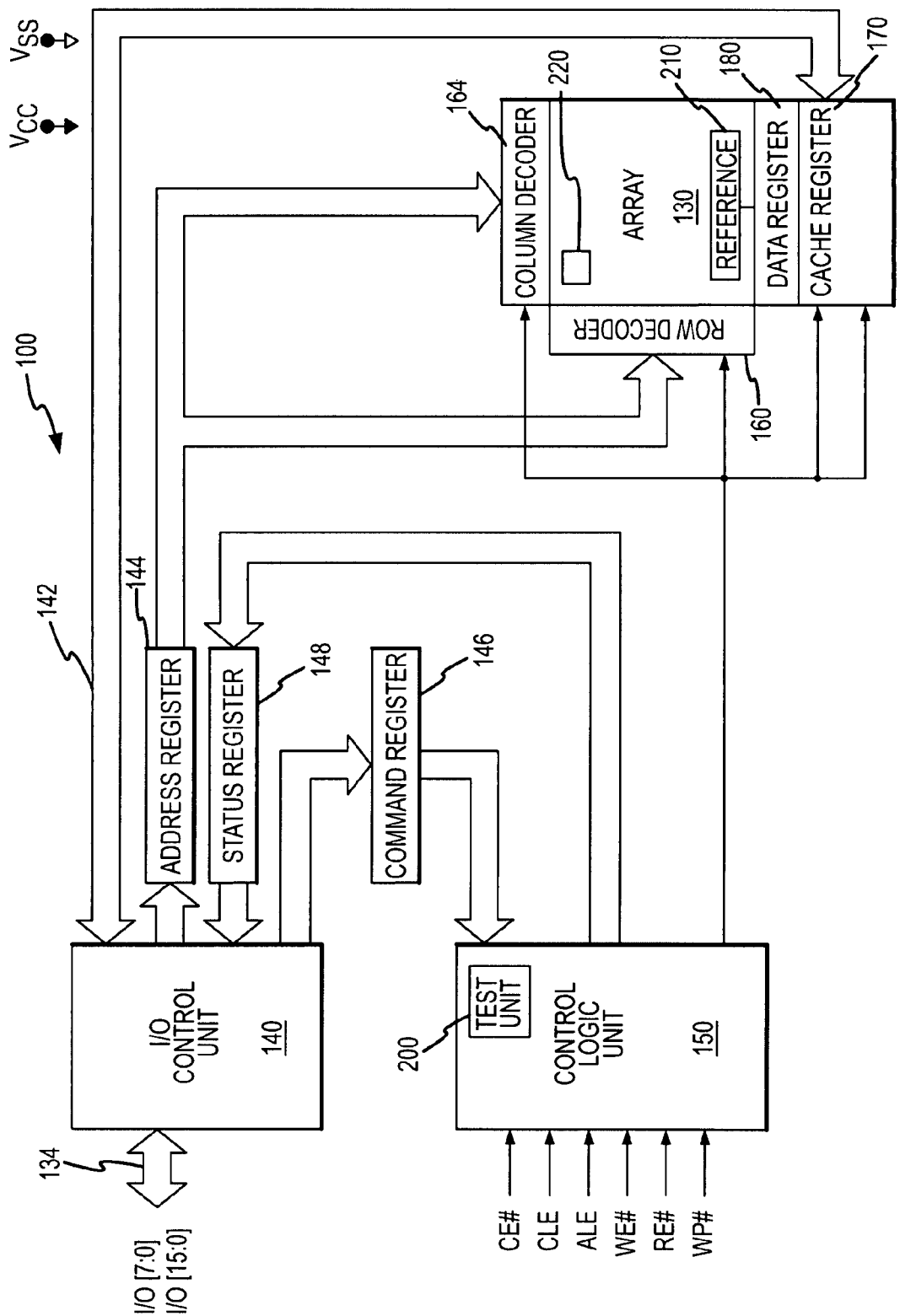
FIG. 3 is a block diagram showing a flash memory device according to an embodiment of the invention.

A flash memory device 100 according to one embodiment of the invention is shown in FIG. 3. The flash memory device 100 includes an array 130 of flash memory cells arranged in banks of rows and columns. The flash memory cells in the array 130 have their control gates coupled to word select lines, drain regions coupled to local bit lines, and source regions selectively coupled to a ground potential as shown in FIG. 1.

Most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that may receive a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, command, address and data signals may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 146 responsive to the rising edge of the WE# signal. The write enable signal WE# is also used to gate write data signals from the memory access device (not shown) to the memory device 100, and the read enable signal RE# is used to gate the read data signals from the memory device 100 to the memory access device (not shown). The I/O control unit 140 transfers the write data signals and read data signals between the I/O bus 134 and the internal data bus 142 when the CLE and ALE signals are both low. Finally, an active low write protect signal WP# prevents the memory device 100 from inadvertently performing programming or erase functions. The control logic unit 150 is also coupled to the internal data bus 142 to receive write data from the I/O control unit 140.

The status register 148 can be read responsive to a read status command. After the read status command, all subsequent read commands will result in status data being read from the status register 148 until a subsequent read status command is received. The status data read from the status register 148 provides information about the operation of the memory device 100, such as whether programming and erase operations were completed without error.

The address register 146 stores row and column address signals applied to the memory device 100. The address register 146 then outputs the row address signals to a row decoder 160 and the column address signals to a column decoder 164. The row decoder 160 asserts word select lines 30 (FIG. 1) corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is generally programmed on a row-by-row or page-by-page basis. After the row address signals have been loaded into the address register 146, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address stored in the address register 146. In a similar manner, during a read operation, data signals from a row or page of memory cells selected by the row address stored in the address register 146 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The control logic unit 150 further includes a test unit 200. The test unit operates to measure the degradation of a cell or cells within the array 130. Based on a measured degradation parameter, the test unit 200 can adjust the read, program or erase signals provided to the cells in the array 130 such as to ensure proper operation of the cell. Other control signals sent to cells in the array 130 may also be changed based on the degradation parameter—including a programming start voltage, a stepping voltage, program time, or read and verify reference voltages.

A variety of parameters of a cell may serve as the degradation parameter, and may be used to determine the extent of degradation of a cell and adjust the control signals accordingly. For example, the transconductance, or $g_m$ of a memory cell in the array 130 may be measured and used to determine how much the operation of the cell has changed. The test unit 200 may measure the $g_m$ of a subject memory cell by varying the voltage applied to the cell and measuring the current across the cell, or vice versa. As will be understood by those in the art, the slope of the resulting curve will yield the $g_m$ of the cell. This measurement may also be referred to as generating a curve representing the bitline current versus the wordline voltage, with the slope of the curve yielding $g_m$ of the cell. In other embodiments, other cell parameters may be used as a degradation parameter—including the $V_t$ of the cell or other characteristics that vary over the life of the cell. If another characteristic is used as the degradation parameter, certain implementation details may differ from those described below.

While the degradation parameter of a cell in the memory array 130 may be measured directly and itself used to vary the control signals sent to the cell, in some embodiments it may be desirable to try to have a more accurate picture of how the cell has changed over time. Rather than just a raw measurement of the present $g_m$ value, a more accurate picture of how the device has changed over time may be desirable. In some embodiments, the test unit 200 can be programmed with values of the degradation parameter over time. However, in some embodiments the array 130 includes one or more reference cells 210. For example, a block of reference cells 210 may be included in the array 130. In some embodiments, the block of reference cells 210 may be conveniently included in the one-time programming (OTP) block of the array 130 that may already be provided on the array 130 for other conventional reasons. Such reference cells 210 could undergo less cycling than other cells in the array 130 (e.g., are not as frequently erased as other cells in the array 130). Accordingly, the test unit can measure a change between the characteristic of a subject cell in the array 130, which has undergone cycling, and the characteristic of a reference cell 210. For example, the test unit 200 can measure the $g_m$ of a subject cell in the array 130 and the $g_m$ of a reference cell to determine how the $g_m$ has drifted. The resultant change in $g_m$ is the degradation parameter that may be used to adjust the control signals for the array 130.

The test unit 200 may measure the degradation parameter of a subject cell in the array 130 and subsequently adjust the control signals provided to that subject cell specifically. However, it may be inconvenient to directly measure the degradation parameter of an active memory cell, i.e., a memory cell that is in use. Accordingly, one or more test cells 220 may be provided in the array 130. The test cells are positioned such that their degradation is representative of one or more cells in the array 130. In one embodiment, a column of test cells 220 are provided in the array 130. In some embodiments, a test cell 220 is provided for each block in the array 130. In other embodiments, a test cell 220 is provided for each column of memory cells in the array 130. The test unit 200 then measures one or more of the test cells 220 instead of directly measuring an active memory cell in the array 130. The measurement of the test cell 220, or the measurement of the test cell 220 as compared with a reference cell 210 then determines a degradation parameter associated with one or more of the memory cells in the array 130. For example, in an embodiment where one test cell 220 is provided in each block of the array 130, the characteristics of that test cell 220 are considered representative of the memory cells in that block. A greater or fewer number of test cells 220 may be provided with implementation details varying accordingly. The test cell 220 can be cycled substantially the same number of times as the active memory cells it represents. For example, it might see approximately the same number of cycles as the active memory cells it represents, in other embodiments the test cell 220 may see within an order of magnitude greater or fewer cycles, in other embodiments, it may see two orders of magnitude greater or fewer cycles.

Figure 4:
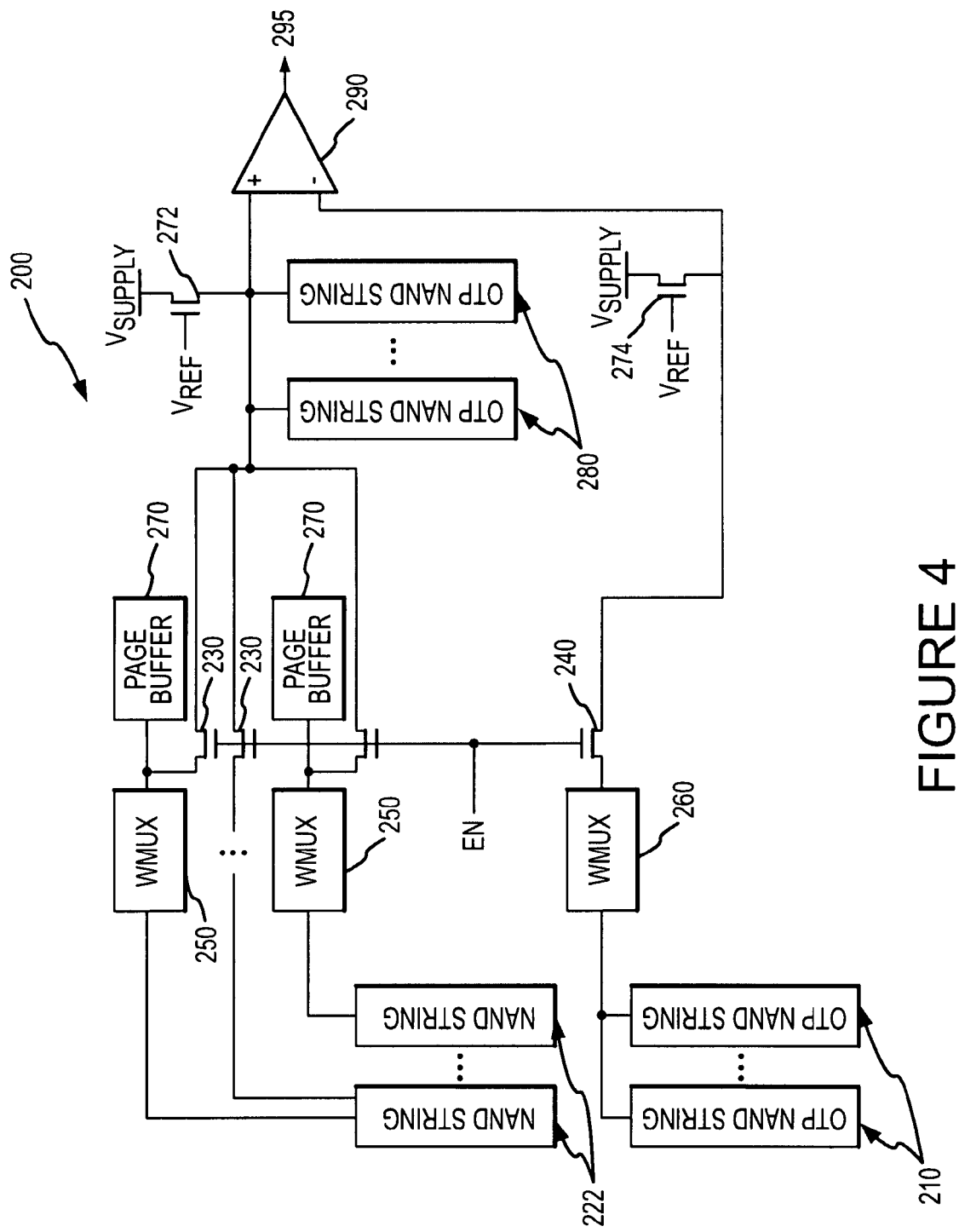
FIG. 4 is a schematic diagram showing a test unit according to an embodiment of the invention.

FIG. 4 is a schematic diagram of an embodiment of a test unit 200. The test unit 200 may be coupled to one or more NAND strings 222 of test cells 220. In other embodiments, when active memory cells are to be measured directly, the test unit 200 is coupled to active memory cells in the array 130. A write multiplexer 250 selects the string 222 of test cells of interest. The test unit 200 may further be coupled to a plurality of reference strings 210 of one-time programmable ("OTP") memory cells. As is well-known in the art, the OTP memory cells are normally programmed only once or possibly a limited number of times, and they can therefore be used to provide an indication of the electrical characteristics of the memory cells in the array 130 before they became degraded with use. The strings 222 are coupled to respective NMOS transistors 230 through respective write multiplexers 250. The multiplexers 250 are also coupled to respective page buffers 270. The page buffers 270 are normally used for program verify and erase verify operations. The references strings 210 are similarly coupled to an NMOS transistor 240 through a write multiplexer 260.

When the transistors 230, 240 are turned ON responsive to a high enable ("EN") signal, the transistors 230 couple the NAND strings 222 to a + input of a comparator 290, and the transistor 240 couples the OTP NAND string 210 to a – input of the comparator 290. NMOS transistors 272 operating as current mirrors precharge the + input of the comparator 290 to a precharge voltage determined by a reference voltage applied to the gate of the transistor 272. Similarly, an NMOS transistor 274 also operating as a current mirror precharges the – input of the comparator 290 to a precharge voltage determined by a reference voltage applied to the gate of the transistor 274. The test unit 200 operates to determine the current through a test cell 220 and a reference cell 210 as voltage across the cells is varied. A pair of OTP NAND strings 280 of memory cells are also coupled to the + input of the comparator 290 to act as a voltage divider with the NAND strings 222 that are also coupled to the + input of the comparator 290. The comparator 290 compares the voltages obtained from the string 222 of test cells and the reference string 210 of memory cells to provide a voltage 295 corresponding to a degradation parameter of the memory cells in the array 130.

Figure 5:
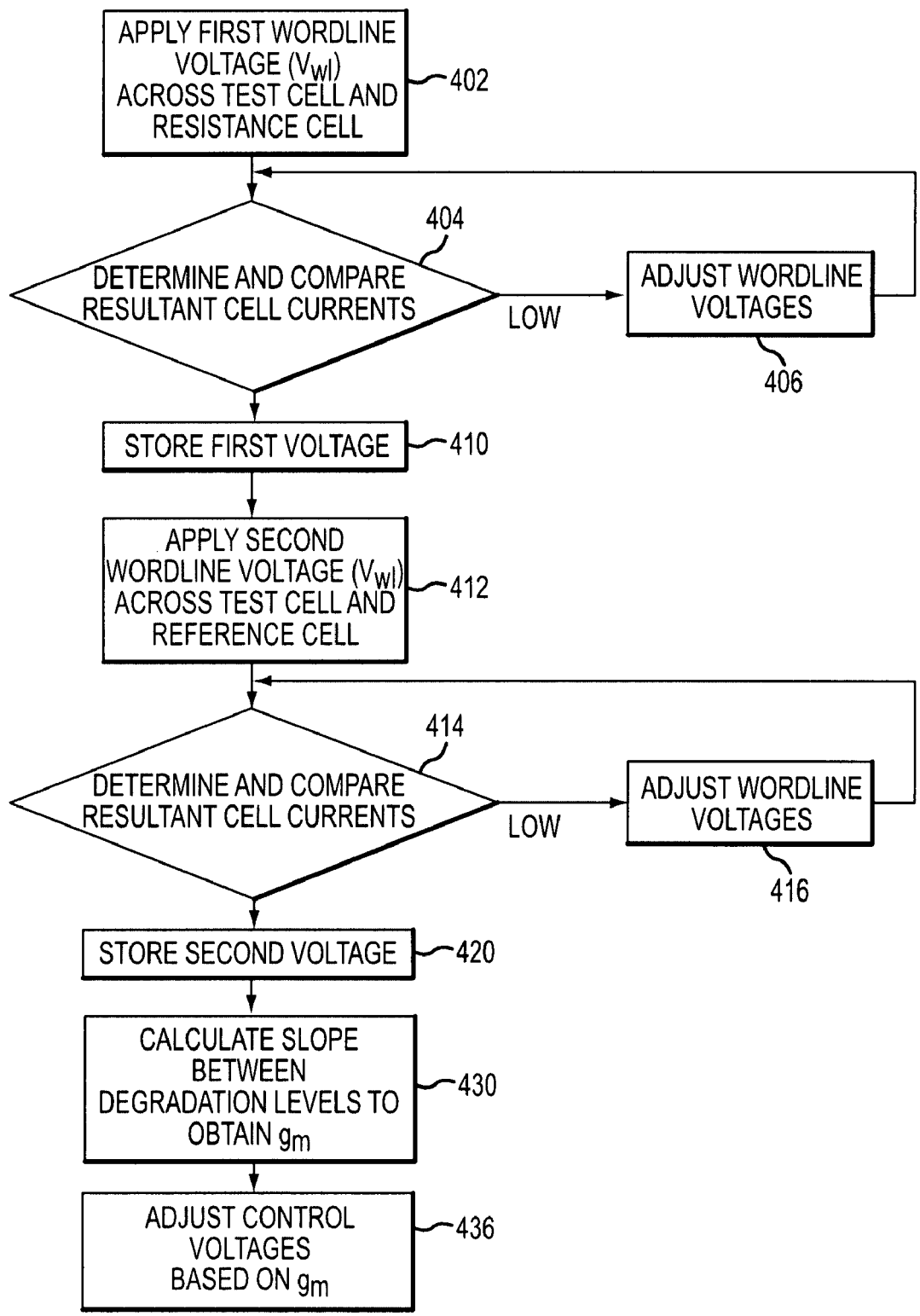
FIG. 5 is a flow chart of one embodiment of a process for calculating a memory cell transconductance slope.

In use, the test unit 200 can implement the comparison of the test cell and reference cells for calculating a transconductance slop in a variety of ways, such as according to an embodiment of a method 400 shown in the flow chart of FIG. 5. Although one process of implementing an embodiment of the invention is described, other implementations would be possible. The test unit 200 may apply a first voltage, such as a first wordline voltage ($V_{WL}$) across a cell in the string 222 of test cells and across a cell in the string 210 of a reference cells at step 402. The test unit 200 then determines the resultant current through each cell and compares these currents at step 404. If the compared current is too low, the wordline voltages are adjusted at step 406, such as increased, and a new comparison is made at step 404. Once an acceptable voltage is found, this acceptable voltage or a voltage that is a function of it is stored at step 410 for use as a control voltage, such as $V_{pgm}$ to program memory cells in the array. Steps 402-410 are repeated in steps 412-420 using a different wordline voltage at step 412 to obtain two current comparisons. In other words, the test unit 200 may obtain a first current comparison using a first voltage in steps 402-410, and a second current comparison using a second voltage in steps 412-420. A slope between the two current degradation levels is then calculated at step 430 to yield a $g_m$ value. Control voltages can then be adjusted at step 436 based on the $g_m$ value. Of course, more comparison points can be taken to obtain additional detail about the slope or the $g_m$ value compared. Generally, a comparison and measurement of a degradation parameters is obtained before each program sequence. The adjustment process may occur less or more often in other embodiments, however.

Figure 6:
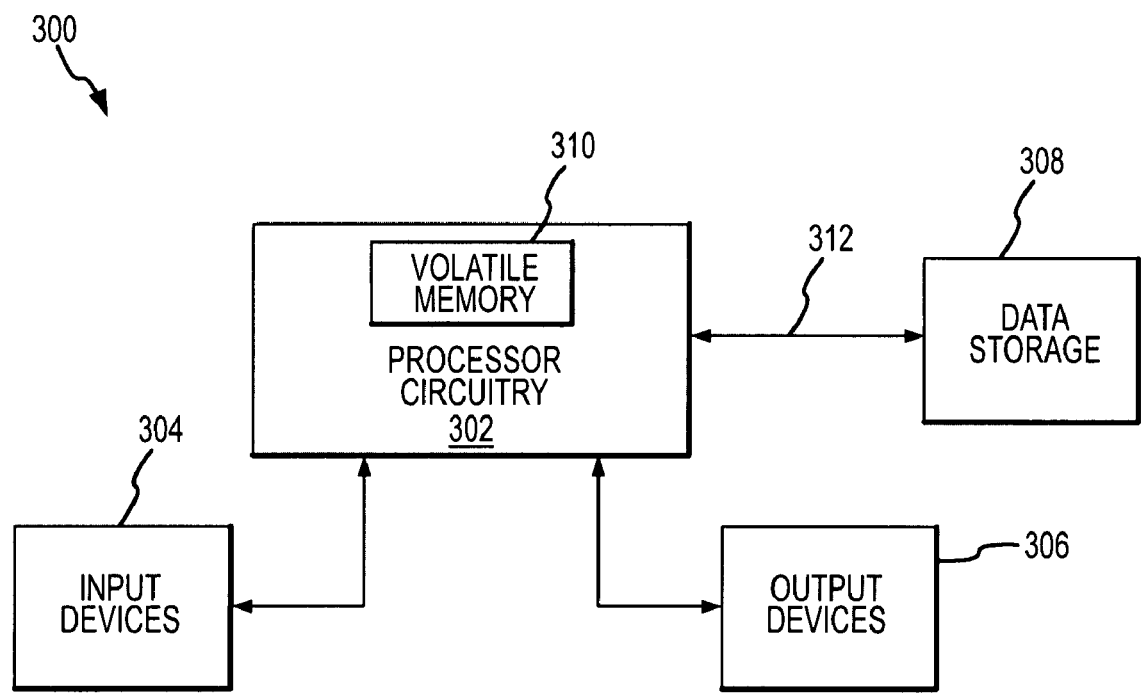
FIG. 6 is a simplified block diagram of a processor-based system including the flash memory device of FIG. 3.

FIG. 6 is a block diagram of a processor-based system 300 including processor circuitry 302 having a volatile memory 310. The processor circuitry 302 is coupled through address, data, and control buses to the memory 310 to provide for writing data to and reading data from the memory 310. The processor circuitry 302 includes circuitry for performing various processing functions, such as executing specific software to perform specific calculations or tasks. The processor-based system 300 also includes one or more input devices 304 coupled to the processor circuitry 302 to allow an operator to interface with the processor-based system 300. Examples of input devices 304 include keypads, touch screens, and scroll wheels. The processor-based system 300 also includes one or more output devices 306 coupled to the processor circuitry 302 to provide output information to the operator. In one example, the output device 306 is a visual display providing visual information to the operator. Data storage 308 may also be coupled to the processor circuitry 302 through a bus 312 to store data that is to be retained even when power is not supplied to the processor-based system 300 or to the data storage 308. The data storage 308 may be the flash memory device 100 shown in FIG. 3 or a flash memory device according to some other embodiment of the invention.

Although the present invention has been described with reference to the disclosed embodiments, persons skilled in the art will recognize that changes may be made in form and detail without departing from the spirit and scope of the invention. Such modifications are well within the skill of those ordinarily skilled in the art. Accordingly, the invention is not limited except as by the appended claims.

We claim:

1. A device comprising:
   an array of memory cells including a subject memory cell, the array of memory cells further including a reference memory cell and a test memory cell associated with the subject memory cell,
   a unit operable to determine a degradation parameter associated with the subject memory cell at least in part by comparing a characteristic of the reference memory cell with a characteristic of the test memory cell; and
   a control unit operable to couple a control signal provided to the subject memory cell wherein the control signal can be adjusted based, at least in part, on the degradation parameter.

2. A device according to claim 1 wherein the array of memory cells comprises a NAND flash array.

3. A device according to claim 1 wherein the reference memory cell characteristic includes a transconductance of a device in the reference memory cell.

4. A device according to claim 3 wherein the degradation parameter comprises a transconductance difference between the reference memory cell and the subject memory cell.

5. A device according to claim 1 wherein the control unit is operable to change a voltage of the control signal responsive to the degradation parameter.

6. A device according to claim 1 wherein the array of memory cells is arranged in a plurality of columns, and wherein the array includes at least one test memory cell associated with each of the plurality of columns.

7. A device according to claim 6 wherein the unit is further operable to determine the degradation parameter for all the memory cells in a particular column by comparing a characteristic of the test memory cell associated with the respective column and a characteristic of the reference memory cell.

8. A device according to claim 1 wherein the control unit is operable to couple an erase signal to the subject memory cell without coupling the erase signal to the reference memory cell.

9. A device according to claim 1 wherein the subject memory cell is operable to degrade as the memory device is used, but the reference memory cell is not operable to degrade as substantially as the subject memory cell as the memory device is used.

10. A device according to claim 1 wherein the control signal comprises at least one of a programming start voltage, a stepping voltage, a read reference voltage and a verify reference voltage.

11. A device according to claim 1 wherein the control unit is operable to adjust the control signal at least in part on the basis of a change in the degradation parameter over time.

12. A system comprising:
   a processor; and
   a device coupled to the processor, comprising:
   an array of memory cells operable to be programmed with data received from and/or provided to the processor, the array of memory cells including a subject memory cell and a reference memory cell;
   a unit operable to determine a degradation parameter associated with the subject memory cell by comparing a characteristic of the reference memory cell characteristic with a characteristic of the subject memory cell;
   a control unit operable to couple a control signal provided to the subject memory cell wherein the control signal can be adjusted at least in part on the degradation parameter; and
   wherein the array further includes a test memory cell associated with the subject cell, the test unit operable to determine the degradation parameter based, at least in part, on a comparison between a characteristic of the test memory cell and characteristic of the reference memory cell.

13. A system according to claim 12 wherein the reference memory cell characteristic includes a transconductance of a device in the reference memory cell.

14. A system according to claim 12 wherein the control unit is operable to change a voltage of the control signal responsive to the degradation parameter.

15. A system according to claim 12 wherein the array includes a plurality of columns of memory cells and a test memory cell associated with each of the columns, the test unit is further operable to determine the degradation parameter for all the memory cells in a column by comparing a characteristic of the test memory cell associated with the respective column and a characteristic of the reference memory cell.

16. A system according to claim 12 wherein the array of memory cells is arranged in a plurality of blocks, the array further including at least one test memory cell associated with each of the plurality of blocks.

17. A system according to claim 16 wherein the unit is further operable to determine the degradation parameter for all the memory cells in a respective block by comparing a characteristic of the test memory cell associated with the respective block and a characteristic of the reference memory cell.

18. A system according to claim 12 wherein the subject memory cell is operable to degrade as the memory device is used, but the reference memory cell is not operable to degrade as substantially as the subject memory cell as the memory device is used.

19. The system of claim 12 wherein the reference cell in included in a one-time programming block of memory cells in the array.

20. A system according to claim 12 wherein the control unit is operable to change a voltage of the control signal responsive to the degradation parameter.

21. A method comprising:
- determining a degradation parameter associated with a subject memory cell by comparing a characteristic of a test memory cell with a characteristic of the subject memory cell; and
- adjusting a control signal for the subject memory cell based, at least in part, on the degradation parameter.

22. A method according to claim 21 wherein the degradation parameter comprises a transconductance of a device in the subject memory cell.

23. The method of claim 22 wherein the act of determining a degradation parameter comprises determining the transconductance of the device by varying the voltage applied to the subject memory cell and measuring the current through the memory cell.

24. The method of claim 22 wherein the act of determining a degradation parameter comprises determining the transconductance of the device by varying the current through the subject memory cell and by measuring the voltage across the subject memory cell.

25. A method according to claim 21 wherein the act of determining a degradation parameter comprises comparing a characteristic of a reference memory cell with a characteristic of the subject memory cell.

26. A method according to claim 21 wherein the act of adjusting the control signal comprises adjusting a voltage of an erase signal.

27. A method according to claim 21 wherein the act of adjusting the control signal comprises adjusting at least one of a programming start voltage, a stepping voltage, a read reference voltage and a verify reference voltage.

28. A device comprising:
- an array of memory cells including a subject memory cell, a test memory cell associated with the subject memory cell, and a reference memory cell, the array being configured to cause the test memory cell to degrade at substantially the same rate as the subject memory cell and to cause the reference memory cell to degrade at a rate that is substantially less that the rate that the subject memory cell degrades;
- a unit operable to determine a degradation parameter associated with the subject memory cell at least in part by comparing a characteristic of the reference memory cell with a characteristic of the test memory cell; and
- a control unit operable to couple a control signal provided to the subject memory cell wherein the control signal can be adjusted based, at least in part, on the degradation parameter.

29. The device of claim 28 wherein the array of memory cells comprises an array of non-volatile memory cells.

30. The device of claim 28 wherein the compared characteristic includes a memory cell transconductance.

31. The device of claim 28 wherein a control unit is configured to change a voltage of the control signal responsive to the degradation parameter.

32. The method of claim 21 wherein the test memory cell is configured to degrade at substantially the same rate as the subject memory cell.

33. The method of claim 25 wherein the reference memory cell is configured to degrade at a rate that is substantially less that the rate that the subject memory cell degrades.

34. A method comprising:
- determining a degradation parameter associated with a subject memory cell by comparing a characteristic of a reference memory cell with a characteristic of a test memory cell associated with the subject memory cell, the test memory cell being configured to degrade at substantially the same rate that the subject memory cell degrades, and the reference memory cell be configured to degrade at a rate that is substantially less that the rate that the subject memory cell degrades; and
- adjusting a control signal for the subject memory cell based, at least in part, on the degradation parameter.

35. The method of claim 34 wherein the degradation parameter comprises a memory cell transconductance.

36. The method of claim 35 wherein the act of determining a degradation parameter comprises determining the memory cell transconductance by varying the voltage applied to a memory cell and measuring the current through the memory cell to which the voltage is applied.

37. The method of claim 35 wherein the act of determining a degradation parameter comprises determining the memory cell transconductance by varying the current through a memory cell and measuring the voltage across the memory cell through which the current is varied.

38. The method of claim 34 wherein the act of adjusting the control signal comprises adjusting a voltage of an erase signal.

39. The method of claim 34 wherein the act of adjusting the control signal comprises adjusting at least one of a programming start voltage, a stepping voltage, a read reference voltage and a verify reference voltage.

* * * * *

UNITED STATES PATENT AND TRADEMARK OFFICE
CERTIFICATE OF CORRECTION

| | | |
|---|---|---|
| PATENT NO. | : 7,894,264 B2 | Page 1 of 1 |
| APPLICATION NO. | : 11/983241 | |
| DATED | : February 22, 2011 | |
| INVENTOR(S) | : Chang Wan Ha et al. | |

It is certified that error appears in the above-identified patent and that said Letters Patent is hereby corrected as shown below:

In column 8, line 62, in Claim 19, delete "in" and insert -- is --, therefor.

In column 9, line 39, in Claim 28, after "less" delete "that" and insert -- than --, therefor.

In column 10, line 14, in Claim 33, after "less" delete "that" and insert -- than --, therefor.

In column 10, line 23, in Claim 34, after "less" delete "that" and insert -- than --, therefor.

Signed and Sealed this
Twenty-sixth Day of April, 2011

David J. Kappos
*Director of the United States Patent and Trademark Office*